(12) United States Patent  
Guo et al.

(10) Patent No.: US 11,444,340 B2  
(45) Date of Patent: Sep. 13, 2022

(54) BATTERY MODULE WITH TEMPERATURE COLLECTING UNIT

(71) Applicants: CALB Co., Ltd., Jiangsu (CN); CALB Technology Co., Ltd., Jiangsu (CN)

(72) Inventors: Qixin Guo, Luoyang (CN); Junhui Liu, Changzhou (CN); Yawei Wang, Changzhou (CN); Zhenqing Wang, Changzhou (CN)

(73) Assignees: CALB Co., Ltd., Jiangsu (CN); CALB Technology Co., Ltd., Jiangsu (CN)

( * ) Notice: Subject to any disclaimer, the term of this patent is extended or adjusted under 35 U.S.C. 154(b) by 99 days.

(21) Appl. No.: 17/012,012

(22) Filed: Sep. 3, 2020

(65) Prior Publication Data

US 2021/0265677 A1   Aug. 26, 2021

(30) Foreign Application Priority Data

Feb. 26, 2020   (CN) .......................... 202010119700.8

(51) Int. Cl.
*H01M 10/48* (2006.01)
*H01M 10/6554* (2014.01)
*H01M 50/528* (2021.01)
*H01M 10/42* (2006.01)
*H05K 1/02* (2006.01)

(52) U.S. Cl.
CPC ....... *H01M 10/486* (2013.01); *H01M 10/425* (2013.01); *H01M 10/4207* (2013.01); *H01M 10/482* (2013.01); *H01M 10/6554* (2015.04); *H01M 50/528* (2021.01); *H05K 1/028* (2013.01); *H01M 2200/105* (2013.01)

(58) Field of Classification Search
CPC ........... H01M 10/486; H01M 10/6554; H01M 10/4207; H01M 10/425; H01M 10/482; H01M 50/528
See application file for complete search history.

(56) References Cited

U.S. PATENT DOCUMENTS

| | | | |
|---|---|---|---|
| 2014/0227570 | A1 | 8/2014 | Hoshi et al. |
| 2015/0072209 | A1 | 3/2015 | Tyler et al. |
| 2018/0090735 | A1* | 3/2018 | Huff .................... H01M 10/482 |
| 2020/0411924 | A1* | 12/2020 | Yun ...................... H01M 10/48 |

FOREIGN PATENT DOCUMENTS

| | | |
|---|---|---|
| CN | 207116634 | 3/2018 |
| CN | 108198990 | 6/2018 |
| CN | 209860056 | 12/2019 |
| EP | 3316338 | 5/2018 |

(Continued)

OTHER PUBLICATIONS

"Search Report of Europe Counterpart Application", dated Mar. 3, 2021, p. 1-p. 7.

(Continued)

*Primary Examiner* — Jimmy Vo
(74) *Attorney, Agent, or Firm* — JCIP Global Inc.

(57) ABSTRACT

A battery module is provided. The battery module provided by the disclosure includes a battery and a temperature collecting unit. The temperature collecting unit includes a support plate and a thermal element. The thermal element is disposed on an upper surface of the support plate. A lower surface of the support plate is attached to the battery.

18 Claims, 3 Drawing Sheets

(56) References Cited

FOREIGN PATENT DOCUMENTS

| JP | 2015078851 | 4/2015 | | |
|----|------------|--------|---|---|
| JP | 6314413 | 4/2018 | | |
| KR | 101807868 | 12/2017 | | |
| WO | WO-2019177275 A1 * | 9/2019 | .......... | H01M 10/425 |

OTHER PUBLICATIONS

Office Action of China Counterpart Application, with English translation thereof, dated Jan. 19, 2022, pp. 1-16.
"Office Action of Counterpart China Application No. 202010119700.8", with English translation thereof, dated May 18, 2022, p. 1-p. 15.

* cited by examiner

BATTERY MODULE WITH TEMPERATURE COLLECTING UNIT

CROSS-REFERENCE TO RELATED APPLICATION

This application claims the priority benefit of China application serial no. 202010119700.8, filed on Feb. 26, 2020. The entirety of the above-mentioned patent application is hereby incorporated by reference herein and made a part of this specification.

TECHNICAL FIELD

The disclosure relates to the technical field of battery, and more particularly, to a battery module.

BACKGROUND

A battery module usually includes multiple batteries. Multiple batteries may be connected in series or parallel through a busbar or other structures to output electrical energy. In order to effectively monitor the temperature of the battery, a temperature collecting unit may be provided in the battery module. Normally, the temperature collecting unit indirectly collects the temperature of the battery according to the heat of the battery transferred through the busbar or other structures. In this process, because the heat of the battery will be affected by the busbar or other structures, the temperature collected by the temperature collecting unit cannot accurately reflect the temperature of the battery.

SUMMARY

The battery module provided by the disclosure includes a battery and a temperature collecting unit; the temperature collecting unit comprising a support plate and a thermal element, the thermal element being disposed on an upper surface of the support plate; a lower surface of the support plate being attached to the battery.

The battery module provided by another aspect of the disclosure includes a battery, a temperature collecting unit and wiring harness plate; wherein the temperature collecting unit includes a support plate, a thermal element and a protective structure; the support plate includes a flexible circuit board, the flexible circuit board includes a main portion and a branch portion, and the branch portion is connected to the main portion; the thermal element is disposed on an upper surface of the branch portion of the flexible circuit board; the protective structure includes a rigid stand and an elastic stand, the rigid stand is disposed on the upper surface of the branch portion of the flexible circuit board, the elastic stand is disposed on a top portion of the rigid stand, and the rigid stand and the elastic stand are disposed surrounding a periphery of the thermal element to protect the thermal element; a lower side of the wiring harness plate is provided with an accommodating slot, and a sidewall of the accommodating slot is provided with a wiring passage; the branch portion of the flexible circuit board extends into the accommodating slot through the wiring passage to dispose the thermal element within the accommodating slot; and a reinforcing plate is disposed on a lower surface of the branch portion of the flexible circuit board, and a lower surface of the reinforcing plate is attached to the battery.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

Figure 1:
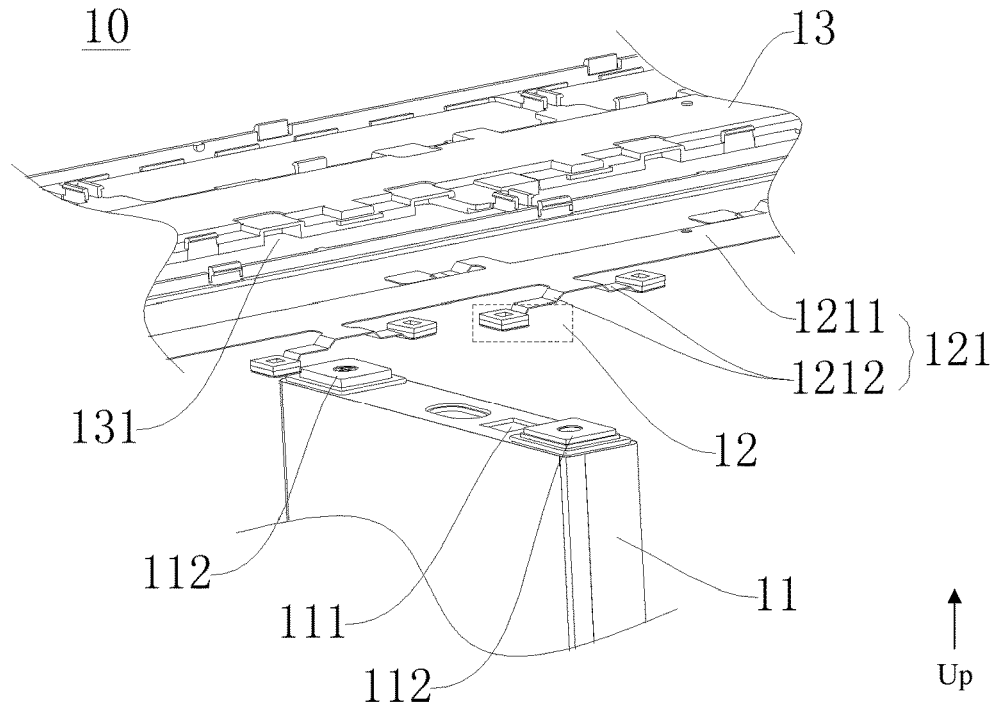
FIG. 1 is a partial exploded view of a battery module according to an embodiment of the disclosure.

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

In particular, a reference to"the" object or "a" and "an" object is intended to denote also one of a possible plurality of such objects. Unless otherwise defined or described, the terms "connect", "fix" should be broadly interpreted, for example, the term "connect" can be "fixedly connect", "detachably connect", "integrally connect", "electrically connect" or "signal connect". The term "connect" also can be "directly connect" or "indirectly connect via a medium". For the persons skilled in the art, the specific meanings of the abovementioned terms in the present disclosure can be understood according to the specific situation.

Further, in the description of the present disclosure, it should be understood that spatially relative terms, such as "above", "below" "inside", "outside" and the like, are described based on orientations illustrated in the figures, but are not intended to limit the exemplary embodiments of the present disclosure.

In the context, it should also be understood that when an element or features is provided "outside" or "inside" of another element(s), it can be directly provided "outside" or "inside" of the other element, or be indirectly provided "outside" or "inside" of the another element(s) by an intermediate element.

In order to enable those skilled in the art to better understand the technical solutions of the disclosure, the following describes the embodiments of the disclosure in detail with reference to the accompanying drawings.

The disclosure provides a battery module capable of accurately collecting the temperature of the battery. The embodiments of the disclosure may provide the following advantageous effect. In the battery module according to the embodiments of the disclosure, the thermal element is provided on the upper surface of the support plate, and the lower surface of the support plate is attached to the battery, so that the temperature of the battery may be directly transferred from the support plate to the thermal element. As a result, the temperature collecting unit can more accurately measure the temperature of the battery. Accordingly, since the heat transfer link between the battery and the thermal element may be effectively reduced, the thermal element can more accurately reflect the temperature of the battery.

Figure 2:
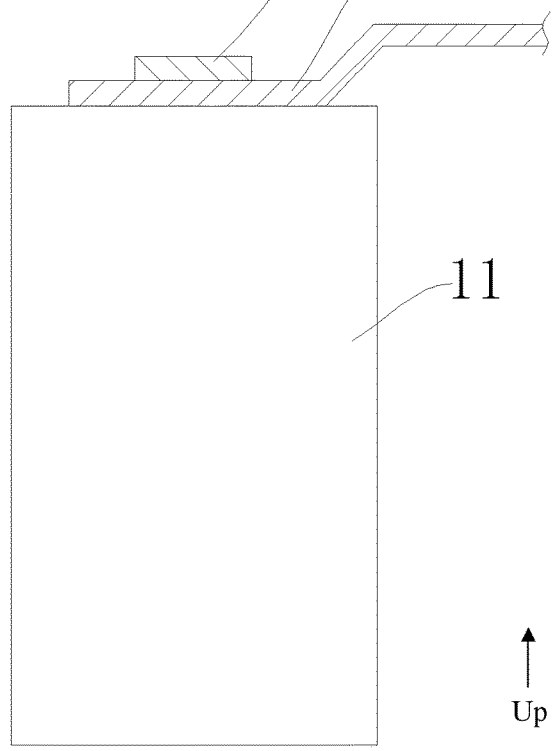
FIG. 2 is a cross-sectional exploded view of a battery module according to an embodiment of the disclosure.

As shown in FIG. 1, an embodiment of the disclosure provides a battery module 10, which includes a battery 11 and a temperature collecting unit 12. With reference to FIG. 2, the temperature collecting unit 12 includes a support plate 121 and a thermal element 122. The thermal element 122 is disposed on an upper surface of the support plate 121 (refer to the direction shown in the drawings). A lower surface of the support plate 121 is fixedly attached to a casing of the battery 11. The temperature of the battery 11 may be directly transferred to the thermal element 122 through the support plate 121. Accordingly, a heat transfer link between the battery 11 and the thermal element 122 may be effectively reduced, so that the thermal element 122 can more accurately reflect the temperature of the battery 11.

In practical applications, the battery module 10 may be used in various fields. For example, the battery module 10 described above may be equipped in the fields of vehicles, ships, drones, and the like. Taking a vehicle as an example, the vehicle may be equipped with the battery module 10 described above. The battery 11 in the battery module 10 may provide electric energy for a driving device (e.g., a motor) in the vehicle, and the vehicle can realize driving and other functions under the operation of the driving device. In practical applications, the temperature collecting unit 12 may effectively monitor the temperature of the battery 11 to ensure that the battery 11 is within a reasonable temperature range. For example, when the temperature collecting unit 12 detects that the temperature of the battery 11 is relatively low, a heating device in the vehicle may warm up the battery 11 to improve the efficiency of the battery 11. Alternatively, when the temperature collecting unit 12 detects that the temperature of the battery 11 is relatively high, the heating device in the vehicle may cool down the battery 11 to improve the safety of the battery 11.

In actual implementation, the types of the thermal element 122 may be various.

The thermal element 122 is an element made of a thermosensitive material whose physical properties change as the temperature changes. This kind of element may be installed on a printed circuit board or a flexible circuit board. Thermal elements are usually packaged in a form similar to metal film resistors, small ceramic capacitors, and surface mount soldering elements. In this case, people often call them thermistors. The resistance of some thermistors decreases with increasing temperature, such as a NTC (Negative Temperature Coefficient) thermistor. The resistance value of the NTC thermistor may decrease as the temperature rises. Due to its large temperature coefficient, it may sense small temperature changes, so as to accurately reflect the temperature value of the battery 11. For a temperature detection applied to the surface of certain objects or a specific ambient temperature detection, in order to adapt to the detection environment and facilitate installation, the thermal element is usually made into a variety of packaging forms according to the specific application usually known as thermal sensors. In the disclosure, the thermistor and the thermal sensor are collectively called the NTC thermistor. It can be understood that, in some embodiments, the thermal element 122 is not limited to include only the NTC thermistor. The disclosure is not limited in this regard.

In addition, in actual implementation, the types of the support plate 121 may also be various.

For example, the support plate 121 may be a circuit board. Specifically, the circuit board may be a printed circuit board (PCB) or a flexible printed circuit (FPC). The thermal element 122 may be disposed on the support plate 121 using, but not limited to, processes including welding, surface-mounting or the like, and achieve electrical connection with the support plate 121.

In addition, in actual implementation, the battery module 10 may include a plurality of batteries 11 and the same number of temperature collecting units 12 as the batteries 11. The temperature collecting units 12 may be provided in one-to-one correspondence with the batteries 11 to effectively monitor the temperature of each of the batteries 11. In addition, each of the temperature collecting units 12 may be an independent structural member or a structural member with a certain integrated design. In the following description, the support plate 121 is, for example, the circuit board. As shown in FIG. 1, in an embodiment provided by the disclosure, multiple temperature collecting units 12 share one circuit board 121. Specifically, the circuit board 121 may include a main portion 1211 and branch portions 1212. Each of the branch portions 1212 may be provided with one thermal element 122. It can also be understood that, a circuit board of each of the branch portions 1212 can be divided into the circuit boards in the temperature collecting units 12. This structural arrangement helps in manufacturing and forming the circuit board 121. Therefore, it is advantageous to improve the integrated setting and large-scale production of the temperature collecting unit 12 and reduce the manufacturing cost.

The structure of the temperature collecting unit 12 will be described in detail below.

Figure 3:
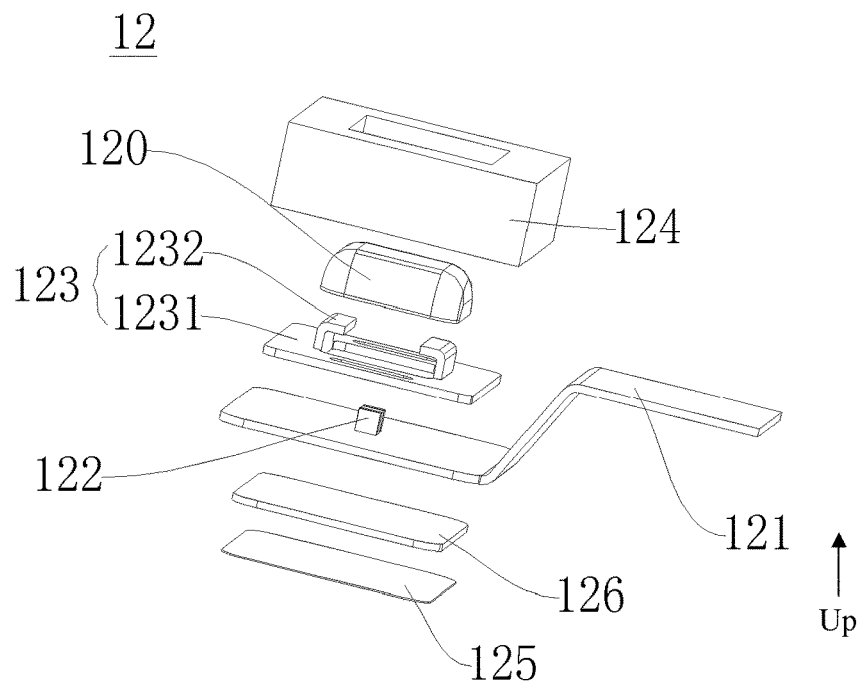
FIG. 3 is an exploded view of a temperature collecting unit according to an embodiment of the disclosure.
Figure 4:
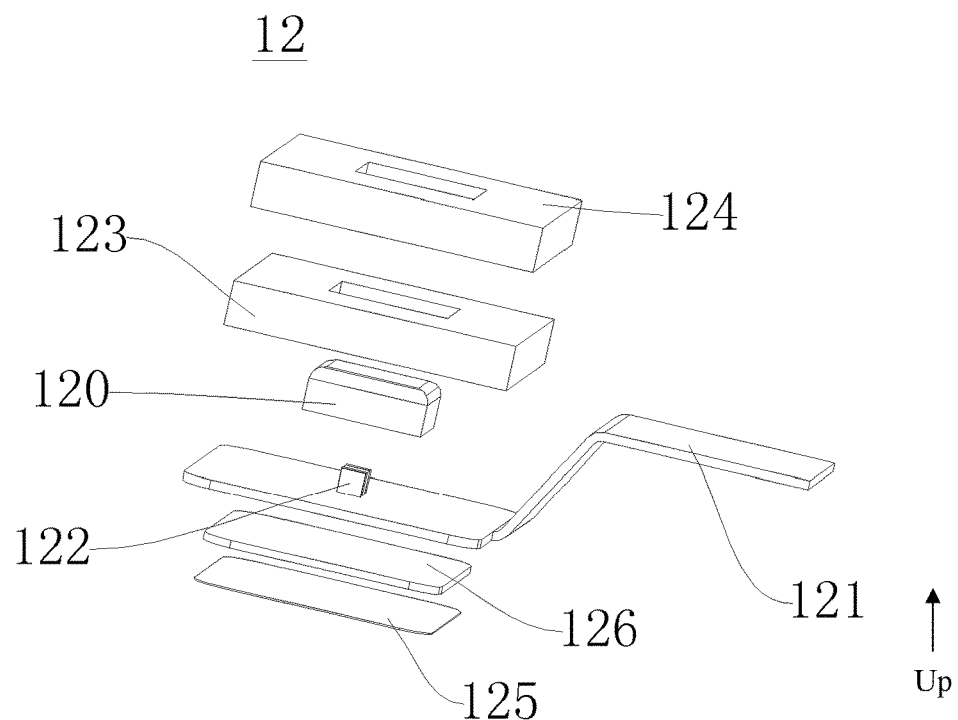
FIG. 4 is an exploded view of another temperature collecting unit according to an embodiment of the disclosure.

As shown in FIG. 3 and FIG. 4, in an embodiment provided by the disclosure, the temperature collecting unit 12 includes the circuit board 121 and the thermal element 122 disposed on the circuit board 121. In order to provide a certain protection function for the thermal element 122 and prevent the thermal element 122 from being damaged under an external force, the temperature collecting unit 12 further includes a protective structure in one embodiment provided by the disclosure. Specifically, the protective structure may be disposed on an upper surface of the circuit board 121 and may surround a periphery of the thermal element 122. When the upper, left, right, front, and rear of the circuit board 121 are impacted by foreign objects, the protective structure may effectively prevent the foreign objects from directly acting on the thermal element 122 to improve a protection performance of the thermal element 122.

In actual implementation, the types and structural forms of the protective structure may be various. Specifically, the protective structure may include a rigid stand 123 or an elastic stand 124. That is, the protective structure may include only the rigid stand 123 or only the elastic stand 124. Alternatively, both the rigid stand 123 and the elastic stand 124 may be included.

For example, as shown in FIG. 3, in one embodiment provided by the disclosure, the protective structure includes the rigid stand 123. Specifically, the rigid stand 123 may include a bottom frame 1231 and a protective claw 1232. The rigid stand 123 is fixedly connected to the circuit board 121 through the bottom frame 1231. The protective claw 1232 extends upward, and surrounds the thermal element 122 in a space enclosed by the bottom frame 1231 and the protective claw 1232.

In actual implementation, the rigid stand 123 may be made of, but not limited to, metal, resin, polyethylene and polypropylene materials. In some embodiments, when the rigid stand 123 is made of the metal material, the rigid stand 123 may be disposed on the circuit board 121 by processes including welding, bonding or the like. When the rigid stand 123 is made of a non-metal material such as resin, the rigid stand 123 may be disposed on the circuit board 121 by processes including bonding or the like.

Further, to improve dustproof and waterproof performances of the thermal element 122, a sealant 120 may also be provided on the periphery of the thermal element 122. Specifically, the sealant 120 may fill a gap between the thermal element 122 and the rigid stand 123. Through this structural arrangement, the protection performance of the thermal element 122 may also be effectively improved. For example, when the rigid stand 123 is deformed due to an external force, the sealant 120 may absorb a certain impact force to weaken the impact force transferred by the rigid stand 123 to the thermal element 122.

In some embodiments, to improve a working performance of the temperature collecting unit 12, the sealant 120 may be made of a material with a favorable thermal conductivity, such as a thermal conductive silicone, so that the heat on the circuit board 121 or the rigid stand 123 may be efficiently transferred to the thermal element 122.

Furthermore, in some embodiments, the protective structure may further include the elastic stand 124. As shown in FIG. 3, specifically, the elastic stand 124 may be a "rectangle donut" shaped structure (a rectangular structure provided with a rectangular hollow) surrounding the periphery of the thermal element 122 (or the rigid stand 123). A height of the elastic stand 124 may be greater than a height of the rigid stand 123. When an upper portion of the circuit board 121 is hit by a foreign object, an impact force will first act on the elastic stand 124. The elastic stand 124 may effectively absorb the impact force through its own elastic deformation. Therefore, the impact force transferred to the rigid stand 123 may be effectively weakened, so as to effectively avoid a bending deformation of the rigid stand 123 due to excessive force and eventually improve a protection effect for the thermal element 122.

In some embodiments, the rigid stand 123 may also be set up as a "rectangle donut" shaped structure, or adopt other shapes and structures. The disclosure is not limited in this regard.

For example, as shown in FIG. 4, in an embodiment provided by the disclosure, the rigid stand 123 is a "rectangle donut" shaped structure, and the elastic stand 124 is also a "rectangle donut" shaped structure. The elastic stand 124 is stacked on an upper side of the rigid stand 123. In actual implementation, a thickness (or height) of the rigid stand 123 may be greater than a thickness (or height) of the thermal element 122, so that the rigid stand 123 may provide a favorable protective effect for the thermal element 122. In actual implementation, the rigid stand 123 and the elastic stand 124 may be fixedly connected by bonding or the like, and the elastic stand 124 may be made of elastic materials such as foam.

Further, in actual implementation, the method for connecting the temperature collecting unit 12 and the battery 11 may also be various.

For example, the temperature collecting unit 12 may be adhesively fixed on the casing of the battery 11. Specifically, as shown in FIG. 3 and FIG. 4, the lower surface of the circuit board 121 may be provided with a bonding layer 125, and the circuit board 121 may be adhesively fixed on the casing of the battery 11 through the bonding layer 125.

In some embodiments, to provide the circuit board 121 with a favorable stress performance, a reinforcing plate 126 may be provided on the lower surface of the circuit board 121. In actual implementation, the reinforcing plate 126 may be a structure integrally formed with the circuit board 121, or may be an additional structural component added later. Specifically, when the circuit board 121 is being manufactured, the reinforcing plate 126 may be directly formed on the lower surface of the circuit board 121. Alternatively, the reinforcing plate 126 may also be a separate plate-like structure, which may be fixed to the lower surface of the circuit board 121 later by processes including bonding, welding or the like.

Figure 5:
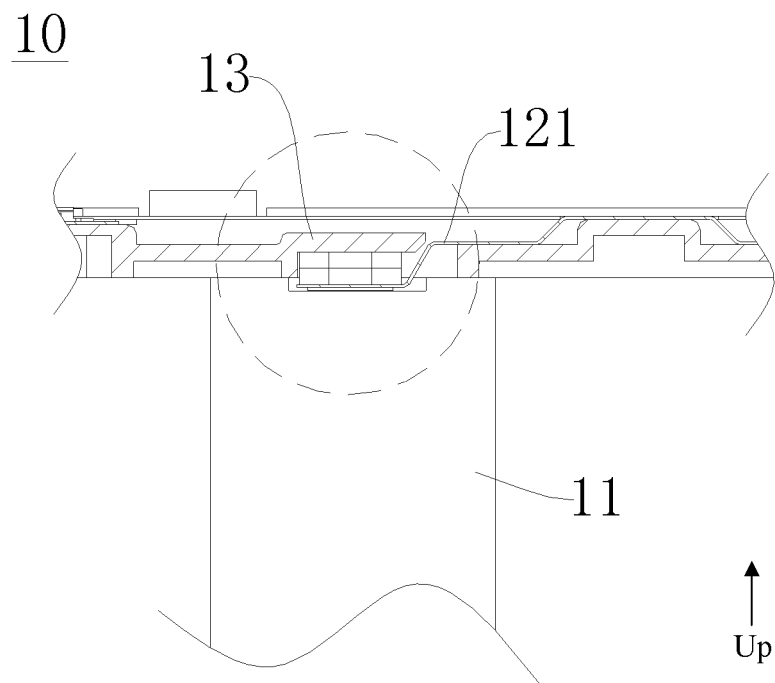
FIG. 5 is a cross-sectional exploded view of a battery module according to an embodiment of the disclosure.
Figure 6:
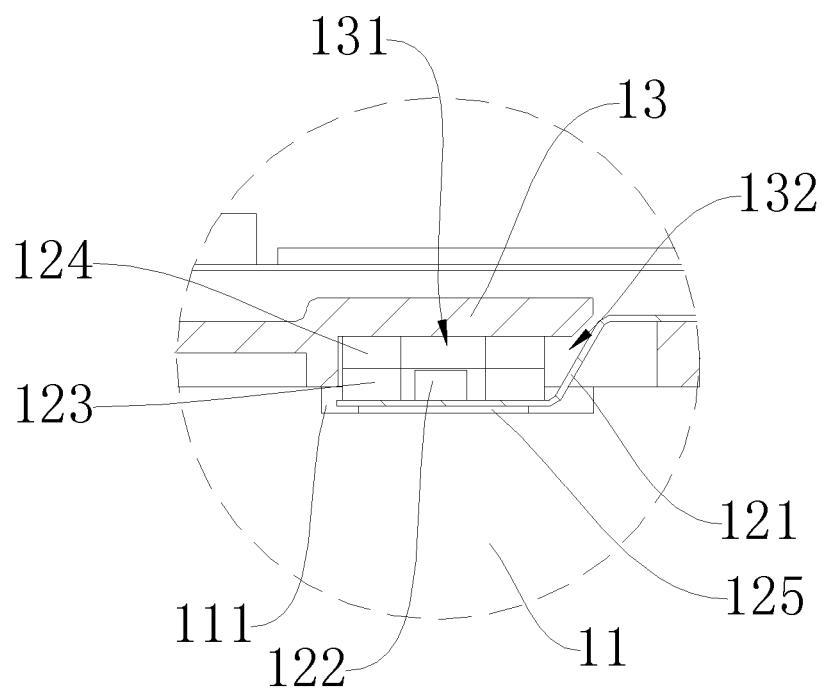
FIG. 6 is a partial enlarged view of FIG. 5.

On the other hand, when the temperature collecting unit 12 and the battery 11 are being fixed together, in order to ensure a positioning accuracy for the temperature collecting unit 12 and the battery 11, a positioning slot 111 may be provided on the casing of the battery 11. As shown in FIG. 5 and FIG. 6, in actual implementation, a depth of the positioning slot 111 may be greater than a height of the temperature collecting unit 12. Alternatively, the depth of the positioning slot 111 may also be equal to or less than the height of the temperature collecting unit 12. Specifically, an upper surface of the temperature collecting unit 12 (or the protective structure) may be lower than a surface of the positioning slot 111. Alternatively, the upper surface of the temperature collecting unit 12 (or the protective structure) may be aligned with the surface of the positioning slot 111, or the upper surface of the temperature collecting unit 12 (or the protective structure) may be higher than the surface of the positioning slot 111. With the above structural arrangement, not only can the positioning accuracy be ensured for the temperature collecting unit 12 and the battery 11, advantages like an improved space utilization rate of the battery module 10 and a reduced space occupation of the battery module 10 may also be achieved.

Further, in some embodiments, the temperature collecting unit 12 and the battery 11 may also be relatively fixed in other forms.

For example, in an embodiment provided by the disclosure, the battery module 10 further includes a wiring harness plate component (not shown in the drawings). The wiring harness plate component may be fixedly connected with the battery. A lower side of the wiring harness plate component may abut a top portion of the protective structure (an upper portion in the drawing). In actual implementation, the wiring harness plate component may further include a wiring harness plate 13. Here, the wiring harness plate 13 may provide a certain supporting action or a protection function for cables and other components in the battery module 10. In addition, in some embodiments, the wiring harness plate 13 may also achieve a relative fixing between the temperature collecting unit 12 and the battery 11. Specifically, a lower surface of the wiring harness plate 13 can abut an upper surface of the elastic stand 124 in the temperature collecting unit 12 to press the temperature collecting unit 12 into a space between the wiring harness plate 13 and the battery 11.

In actual implementation, the temperature collecting unit 12 may only rely on the pressing force of the wiring harness plate 13 to ensure the relative position with the battery 11, or may be combined with the bonding layer 125 described above to improve a stability of the relative position between the temperature collecting unit 12 and the battery 11, so as to prevent the relative position between the temperature collecting unit 12 and the battery 11 from being changed. Specifically, the temperature collecting unit 12 may be fixedly connected to the battery 11 through the bonding layer 125, or a more stable connection between the temperature collecting unit 12 and the battery 11 can be further provided by the pressing force of the wiring harness plate 13, so as to prevent the relative position between the temperature collecting unit 12 and the battery 11 from being changed due to external vibration or collision.

Moreover, in some embodiments, to ensure that the temperature collecting unit 12 are effectively pressed on the battery 11 by the wiring harness plate 13, the elastic stand 124 in the temperature collecting unit 12 may slightly protrude from the positioning slot 111 in the casing of the battery 11; or the upper surface of the temperature collecting unit 12 (or the protective structure) may be higher than the surface of the positioning slot 111.

Further, in actual implementation, a positional relationship between the circuit board 121 and the wiring harness plate 13 may also be various.

For example, the entire circuit board 121 may be completely located in the space between the wiring harness plate 13 and the battery 11. Alternatively, the main portion 1211 in the circuit board 121 may be located on an upper side of the wiring harness plate 13, and the branch portion 1212 (or the temperature collecting unit 12) in the circuit board 121 may be located in the space between the wiring harness plate 13 and the battery 11.

As shown in FIG. 1 and FIG. 6, in an embodiment provided by the disclosure, the main portion 1211 in the circuit board 121 is located on the upper side of the wiring harness plate 13, and the branch portion 1212 (or the temperature collecting unit 12) in the circuit board 121 is located in the space between the wiring harness plate 13 and the battery 11. Specifically, an accommodating slot 131 for accommodating the temperature collecting unit 12 is provided on a lower side of the wiring harness plate 13. A sidewall of the accommodating slot 131 is provided with a wiring passage 132. The branch portion in the circuit board 121 may extend into the accommodating slot 131 from the wiring passage 132, thereby improving the convenience of assembly.

When the battery module 10 is being assembled, a busbar (not shown in the drawing, the busbar may be a conductive plate-like structure such as an aluminum plate in actual implementation) and the battery 11 may be assembled first. Specifically, a plurality of the batteries 11 may be arranged according to predetermined positions. Subsequently, the busbar may be placed above the batteries 11, and the busbar and a pole 112 of the battery 11 may be connected by processes including welding or the like, thereby achieving electrical and mechanical connections between the busbar and the batteries 11. Then, the wiring harness plate 13 and the circuit board 121 may be assembled. Specifically, the main portion 1211 of the circuit board 121 may be placed on the upper side of the wiring harness plate 13 first. Subsequently, the branch portions 1212 (or the temperature collecting unit 12) in the circuit board 121 may be placed in the accommodating slot 131 of the wiring harness plate 13, thereby achieving an assembly process for the wiring harness plate 13 and the circuit board 121. Then, the wiring harness plate 13, the circuit board 121 and the batteries 11 may be assembled. Specifically, an assembly piece composed of the wiring harness plate 13 and the circuit board 121 may be placed above the batteries 11. Next, the wiring harness plate 13 is pressed downwards so that a lower surface of the branch portion 1212 in the circuit board 121 is attached to the casing (or the positioning slot 111) of the battery 11. Then, the wiring harness plate 13 and the batteries 11 may be fixedly connected by using adhesives, screws or other connecting members, thereby achieving the assembly process for integrating the battery module 10.

Other embodiments of the disclosure will be apparent to those skilled in the art from consideration of the specification and practice of the disclosure disclosed herein. The disclosure is intended to cover any variations, uses or adaptations of the disclosure. These variations, uses, or adaptations follow the general principles of the disclosure and include common general knowledge or conventional technical means in the art that are not disclosed in the present disclosure. The specification and embodiments are illustrative, and the real scope and spirit of the present disclosure is defined by the appended claims.

It should be understood that the disclosure is not limited to the precise structures that have been described above and shown in the drawings, and various modifications and variations can be made without departing from the scope thereof. The scope of the disclosure is limited only by the appended claims.

What is claimed is:

1. A battery module, comprising a battery, a temperature collecting unit, and a wiring harness plate, wherein
   the temperature collecting unit comprises a support plate and a thermal element, the thermal element is disposed on an upper surface of the support plate;
   a lower surface of the support plate is attached to the battery;
   a lower side of the wiring harness plate is provided with an accommodating slot, a sidewall of the accommodating slot is provided with a wiring passage, and the temperature collecting unit has a part located in the accommodating slot and another part extending out of the accommodating slot through the wiring passage.

2. The battery module according to claim 1, wherein the temperature collecting unit further comprises a protective structure; and the protective structure is configured for protecting the thermal element.

3. The battery module according to claim 2, wherein the protective structure is disposed on the upper surface of the support plate and surrounds a periphery of the thermal element.

4. The battery module according to claim 2, wherein the protective structure comprises a rigid stand, the rigid stand is disposed on the upper surface of the support plate, the rigid stand surrounds a periphery of the thermal element, and an upper surface of the rigid stand is higher than the thermal element.

5. The battery module according to claim 4, wherein the protective structure comprises an elastic stand.

6. The battery module according to claim 5, wherein the lower side of the wiring harness plate abuts a top portion of the elastic stand.

7. The battery module according to claim 2, wherein the protective structure comprises a rigid stand and an elastic stand, the rigid stand is disposed on the upper surface of the support plate, and the elastic stand is disposed on a top portion of the rigid stand.

8. The battery module according to claim 3, wherein the protective structure comprises a rigid stand and an elastic stand, the rigid stand is disposed on the upper surface of the support plate, and the elastic stand is disposed on a top portion of the rigid stand.

9. The battery module according to claim 4, wherein the protective structure further comprises an elastic stand, the rigid stand is disposed on the upper surface of the support plate, and the elastic stand is disposed on a top portion of the rigid stand.

10. The battery module according to claim 5, wherein the rigid stand is disposed on the upper surface of the support plate, and the elastic stand is disposed on a top portion of the rigid stand.

11. The battery module according to claim 6, wherein the rigid stand is disposed on the upper surface of the support plate, and the elastic stand is disposed on a top portion of the rigid stand.

12. The battery module according to claim 2, wherein a thermal conductive silicone is provided between the protective structure and the thermal element.

13. The battery module according to claim 1, wherein a positioning slot is disposed on a casing of the battery, and at least a part of the temperature collecting unit is located in the positioning slot.

14. The battery module according to claim 7, wherein a positioning slot is disposed on a casing of the battery, and at least a part of the temperature collecting unit is located in the positioning slot.

15. The battery module according to claim 1, wherein a reinforcing plate is disposed on a lower surface of the support plate, and a lower surface of the reinforcing plate is attached to the battery.

16. The battery module according to claim 1, wherein the support plate comprises a flexible circuit board, the flexible circuit board comprises a main portion and a branch portion, the branch portion is connected to the main portion, the thermal element is disposed on the branch portion, the branch portion extends into the accommodating slot through the wiring passage to dispose the thermal element within the accommodating slot.

17. The battery module according to claim 16, wherein a reinforcing plate is disposed on a lower surface of the support plate, and a lower surface of the reinforcing plate is attached to the battery.

18. A battery module, comprising a battery, a temperature collecting unit and wiring harness plate; wherein
the temperature collecting unit comprises a support plate, a thermal element and a protective structure;
the support plate comprises a flexible circuit board, the flexible circuit board comprises a main portion and a branch portion, and the branch portion is connected to the main portion;
the thermal element is disposed on an upper surface of the branch portion of the flexible circuit board;
the protective structure comprises a rigid stand and an elastic stand, the rigid stand is disposed on the upper surface of the branch portion of the flexible circuit board, the elastic stand is disposed on a top portion of the rigid stand, and the rigid stand and the elastic stand are disposed surrounding a periphery of the thermal element to protect the thermal element;
a lower side of the wiring harness plate is provided with an accommodating slot, and a sidewall of the accommodating slot is provided with a wiring passage;
the branch portion of the flexible circuit board extends into the accommodating slot through the wiring passage to dispose the thermal element within the accommodating slot; and
a reinforcing plate is disposed on a lower surface of the branch portion of the flexible circuit board, and a lower surface of the reinforcing plate is attached to the battery.

* * * * *